United States Patent [19]

Nakano

[11] Patent Number: 5,183,781
[45] Date of Patent: Feb. 2, 1993

[54] METHOD OF MANUFACTURING SEMICONDUCTOR DEVICE

[75] Inventor: Eiichi Nakano, Tokyo, Japan
[73] Assignee: NEC Corporation, Tokyo, Japan
[21] Appl. No.: 638,757
[22] Filed: Jan. 8, 1991
[30] Foreign Application Priority Data Jan. 12, 1990 [JP] Japan .................................. 2-5108

[51] Int. Cl.⁵ ...................... H01L 21/28; H01L 21/88
[52] U.S. Cl. .................... 437/191; 437/193; 148/DIG. 131; 156/648
[58] Field of Search ............... 437/186, 189, 191, 193; 148/DIG. 131; 156/646, 648

[56] References Cited

U.S. PATENT DOCUMENTS 4,728,391  3/1988  Lesk .................... 437/193

FOREIGN PATENT DOCUMENTS 0010718   1/1985  Japan .................... 437/191
0222225  10/1986  Japan .................... 437/191
2108541   5/1987  Japan .................... 437/193
0181423   7/1988  Japan .................... 437/193
0205525   8/1989  Japan .................... 437/191
0165625   6/1990  Japan .................... 437/193

OTHER PUBLICATIONS

"Nikkei Microdevices" Mar., 1989, pp. 70–74.
"1987 Symposium on VLSI Technology" The Digest of Technical Papers, pp. 103–104.
Wolf et al., Silicon Processing for the VLSI Era, Lattice Press (1984), pp. 547–551, 251–256.

Primary Examiner—Olik Chaudhuri
Assistant Examiner—Ken Horton
Attorney, Agent, or Firm—Laff, Whitesel, Conte & Saret

[57] ABSTRACT

A process of forming an interconnection layer of polysilicon in a contact hole formed in an interlayer insulating film comprises opening the contact hole, depositing doped and nondoped polysilicon films in sequence, and etching back the polysilicon films by the reactive ion etching technique with at least one carbon fluoride gas to obtain the interconnection layer buried in the contact hole.

6 Claims, 2 Drawing Sheets

METHOD OF MANUFACTURING SEMICONDUCTOR DEVICE

BACKGROUND OF THE INVENTION

The present invention relates to a method of manufacturing a semiconductor device, and more particularly, to a process of forming an interconnection layer buried in a contact hole in an interlayer insulating film.

A connection between a conductive region as of an impurity-diffused layer in a semiconductor substrate or a lower-level wiring layer, and an upper-level wiring layer through the contact hole formed in the interlayer insulating film is one of important techniques in a semiconductor device. In a semiconductor device of a low integration density, contact holes can be of a low aspect ratio, that is, a larger area comparing with the depth. Therefore, the contact holes can be filled by metal such as aluminum when the metal is deposited on the interlayer insulating layer to form the upper-level wiring layer. On the other hand, contact holes of a high integration density device such as a memory device become inevitably a high aspect ratio, that is, a smaller area comparing with the depth. Therefore, so-called buried contact technique in which polycrystalline silicon (hereinafter referred to "polysilicon") is buried as an interconnection material in the contact hole by a process different from the process for forming the upper wiring layer is necessary.

The polysilicon of the interconnection layer is doped with impurity to be low electrical resistant, and fills the contact hole by deposition through a chemical vapor phase deposition (CVD) technique. Three processes for forming interconnection layer are considered: The first comprising forming a doped polysilicon film by CVD while doping impurity and then etching it; the second comprising depositing nondoped polysilicon film and subsequent doping by thermal diffusion or ion implantation; and the third comprising sequentially depositing a nondoped polysilicon film, etching it and doping. The third process is reported in "NIKKEI MICRODEVICES" March, 1989, pp. 70-74, telling that a contact hole is formed, run over with a polysilicon film by CVD and planarized by etch-back, leaving the polysilicon film only in the contact hole. Subsequently ion implantation of impurity and thermal treatment by means of lamp heating are carried out.

The first process can not be used for a contact hole having a aspect ratio of about 1 or more because the deposition of doped polysilicon by CVD can not provide good coverage.

By the second process, it is difficult without subjecting to too thermal treatment to obtain uniform distribution of impurity in the thick polysilicon film formed for filling the contact hole. Ununiform distribution of impurity generally makes the rate of the etching inconstant, resulting in variation in amount and quality of the polysilicon film leaving in the contact hole, and in turn in difficult formation of good connection to the polysilicon film as the interconnection layer.

In the third process, thermal treatment required for the activation must perform without allowing the PN junction already formed in the semiconductor substrate to shift. It, however, is not easy to realize it in the art of highly miniaturized semiconductor elements.

The above-mentioned problem can be solved by the following:

A thin polysilicon film is deposited and an impurity is diffused into it. Next, onto this doped polysilicon film, a thick polysilicon film is deposited to run over a contact hole, and these polysilicon films are etched back, leaving them in the contact hole, thus an interconnection layer being obtainable. A technique of this type is reported in The Digest of Technical Papers, "1987 SYMPOSIUM ON VLSI TECHNOLOGY" pp. 103-104. Generally, the etching back of the polysilicon films mentioned above is conducted by a plasma etching method with a gas producing a large amount of radicals involving fluorine as of sulfur hexafluoride. The plasma of the plasma etching method is produced by applying high frequency power, for example, to external electrodes outside a chamber in which a semiconductor wafer to be etched (worked) is installed and the plasma is produced. Or else, the plasma is produced in a plasma generating room and introduced into the chamber. The plasma etching uses a chemical reaction of the radicals by the plasma and the material (polysilicon) to be etched, and a sputtering phenomenon by ions can be neglected. Therefore, the plasma etching is called as a chemical dry etching, and generally is isotropic etching.

The application of the plasma etching technique like this to the last-mentioned method, particularly for the etching of the polysilicon film, results in producing unwanted irregularities on the surface of the interconnection layer because doped polysilicon films are etched more rapidly than nondoped polysilicon film. By the plasma etching technique, for example, a polysilicon film doped with phosphorus to a level of about $5 \times 10^{20} cm^{-3}$ can be etched at a rate of 1.2 times more than nondoped polysilicon film. Therefore compared with the portion of nondoped polysilicon film projecting from the contact hole the doped polysilicon film surrounding the nondoped-polysilicon portion is etched rapidly to the same level as the surface of the interlayer insulating film. When etching of the nondoped polysilicon film has reached the surface level of the interlayer insulating film, a step results which amounts to an about 20 to 100% to the deposited thickness of the doped polysilicon film. The incorrespondence between the step and the difference in etching rate is due to the microloading effect. Which is apt to occur when the silicon films are etched by the plasma etching method mentioned above. That is, when a polysilicon has a shape finer than a certain size, compared with the center portion, the edge portion is etched rapidly. By the etching speed difference and the microloading effect by the plasma etching method, a narrow groove is produced in the contact hole, and the upper surface of the polysilicon as the interconnection layer in the contact hole becomes irregular. Consequently, the connection between the upper wiring layer and the interconnection layer of polysilicon may be put into poor or high electrical resistance contact.

SUMMARY OF THE INVENTION

It is, therefore, an object of the present invention to provide a method of manufacturing a semiconductor device comprising forming an interconnection layer which is buried in a contact hole opened in an interlayer insulating film and which has a planarized surface that can be brought into a low resistance contact with a wiring layer made thereon.

In the process according to the present invention of manufacturing a semiconductor device on a semiconductor chip having semiconductor elements and an interlayer insulating film, a contact hole extending from the surface of the interlayer insulating film to a conductivity region lying thereunder, such as an impurity-diffused layer, is opened. Then a polysilicon film doped with a specified impurity such as phosphorus and a nondoped polysilicon film are deposited in sequence, thereby the contact hole getting filled with polysilicon. The nondoped polysilicon film is removed substantially the same thickness as that deposited in the preceding processing step by any etching technique, and then the polysilicon films are etched by a reactive ion etching technique with carbon fluoride gas, preferably carbon tetrafluoride ($CF_4$), so as to just expose the surface of the interlayer insulating film.

The reactive ion etching is conducted by applying high frequency power to one of electrodes which are installed in the chamber, and, for example, the electrodes are in parallel to each other, and the semiconductor wafer to be worked (etched) is set on one electrode. Ions in the plasma are injected in the semiconductor wafer perpendicularly to its surface, and the reactive ion etching use the ions to etch the material (polysilicon), that is, use sputtering by impulse of the ions for etching, and therefore, called as a reactive sputtering etching and is, in general, anisotropic etching.

By the reactive ion etching process with carbon fluoride gas, particularly carbon tetrafluoride gas, the etching of nondoped polysilicon film and doped polysilicon film can be carried out at the same rate, and further the microloading mentioned above hardly occur, thus without producing irregularities on the surface of the interconnection layer. Further compared with plasma etching, the reactive ion etching is easily controllable and hence can be set at exact end point to minimize step from the interlayer insulating film. In this way, good contact with the upper wiring layer can be achieved.

BRIEF DESCRIPTION OF THE DRAWINGS

The above-mentioned and other object, features and advantages of this invention will become more apparent by reference to the following detailed description of the invention taken in conjunction with the accompanying drawings, wherein.

DETAILED DESCRIPTION OF THE PREFERRED EMBODIMENT

Figure 1A:
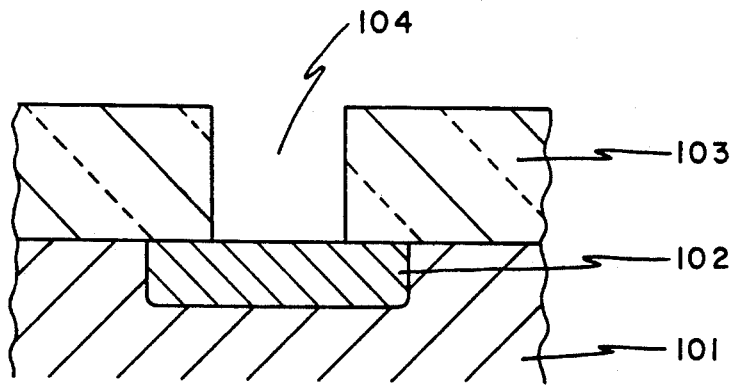
FIGS. 1(a) through 1(f) are fragmentary cross-sectional views of a semiconductor chip for illustrating essential steps of a process embodying the present invention.

An embodiment of the present invention will be described more fully with reference to the drawings hereinafter:

As shown in FIG. 1(a), a p-type silicon substrate 101 and a semiconductor element fabricated thereon: here representatively only an n-type diffusion layer 102 as the source or drain region of a MOS transistor is shown, and the other components of which to be actually present, such as the field oxide film defining the active region, the gate insulating film on the active region, and the gate electrode on the gate insulating film are not shown. An interlayer insulating film 103 of silicon oxide is deposited by CVD technique to a thickness of 1 $\mu$m, and in it a contact hole 104 of 1.2 $\mu$m $\times$ 1.2 $\mu$m in size extending to the underlying n-type conductive diffusion layer 102 is opened by selective etching.

Figure 1B:
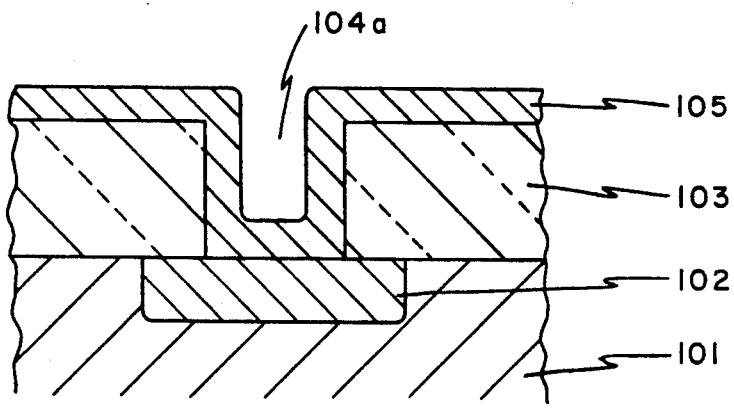

As shown in FIG. 1(b), while supplying phosphorus as an impurity, a doped polysilicon film 105 is grown to a thickness of 0.3 $\mu$m over the whole surface by the low pressure chemical vapor deposition (LPCVD) technique at 550° C. to 650° C., preferably 600° C. Doped polysilicon film 105 has an impurity concentration of $5 \times 10^{20}$ cm$^{-3}$, and is preferred to be as thick as possible though too great thickness may result in unacceptable distortion of the contact hole 104a. The suitable thickness is about 25% of the size (here 1.2 $\mu$m) of contact hole 104.

Figure 1C:
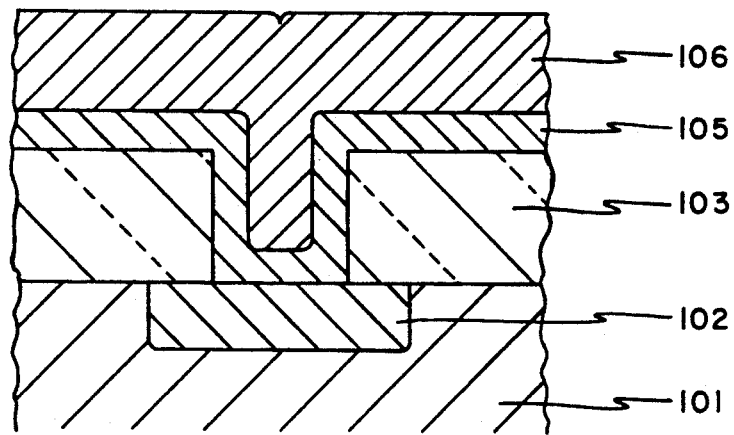

In the next step, as shown in FIG. 1(c), a non-doped polysilicon film 106 is deposited to a thickness of 1 $\mu$m to fill the contact hole 104a under the same growth conditions as for the doped polysilicon film 105 above-described except that no impurity is supplied. The thickness of the nondoped polysilicon film may be much the same as size (here 0.6 $\mu$m) of the contact hole 104a to obtain a substantially planarized surface. The word "nondoped polysilicon" means that at its forming, any gas containing impurity such as phosphorus, arsenic, boron, etc. does not intentionally flow.

Figure 1D:
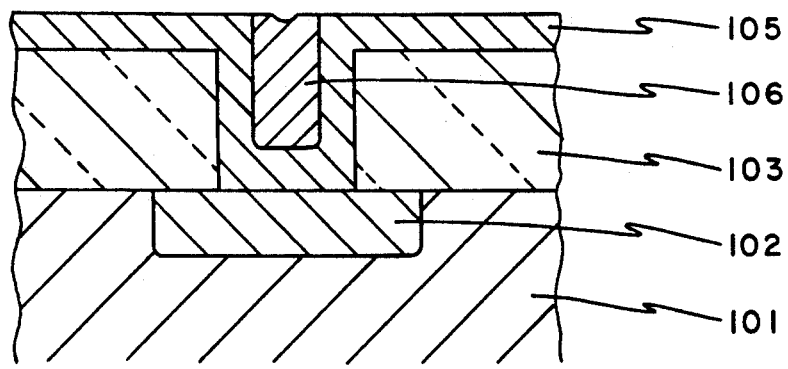

In the next step, the polysilicon films are etched by the reactive ion etching process with sulfur hexafluoride ($SF_6$) by a thickness between 0.8 and 1.1 $\mu$m, preferably such a thickness (1 $\mu$m) that the entire surface of the doped polysilicon film 105 is just exposed excluding on the area of the contact hole, as shown in FIG. 1(d). The conditions for carrying out it are flow rate of $SF_6$ gas 20 to 300 SCCM, preferably 50 SCCM; pressure 5 to 60 Pa, preferably 30 Pa; and effective power density of dry etching system 2 to 15 W/cm$^2$, preferably 5 W/cm$^2$.

Figure 1E:
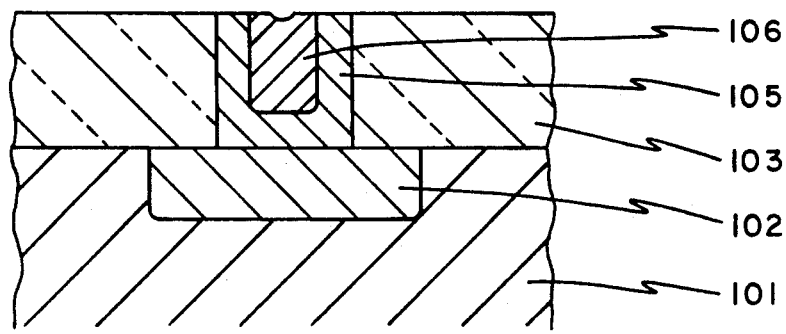

Subsequently the remaining doped polysilicon film 105 on the surface of the interlayer insulating film 103 and the nondoped polysilicon film 106 are etched by the same thickness, as shown in FIG. 1(e), by the reactive ion etching technique with $CF_4$ gas and the same etching system under the conditions: flow rate of $CF_4$ gas 20 to 200 SCCM, preferably 50 SCCM; pressure 5 to 60 Pa, preferably 30 Pa, and effective power density 2 to 30 W/cm$^2$, preferably 8 W/cm$^2$.

Since the reactive ion etching rate of a polysilicon film is not so dependent on impurity in it, and particularly with $CF_4$ gas, substantially-planarized surface of the interconnection layer consisting of doped and nondoped polysilicon films 105, 106 can be obtained, as shown in FIG. 1(e). The etching rate of any polysilicon film by the reactive ion etching technique with $CF_4$ is about 100 nm/min, and the control of it is easy. It therefore can be performed without giving rise to step between the surfaces of the doped and nondoped polysilicon films 105, 106.

Thereafter doping and thermal treatment may be carried out without needing diffusion of impurity arriving to the bottom portion and the side portion of the contact hole because the doped polysilicon film 105 has already been deposited onto the bottom and inside of the contact hole.

Figure 1F:
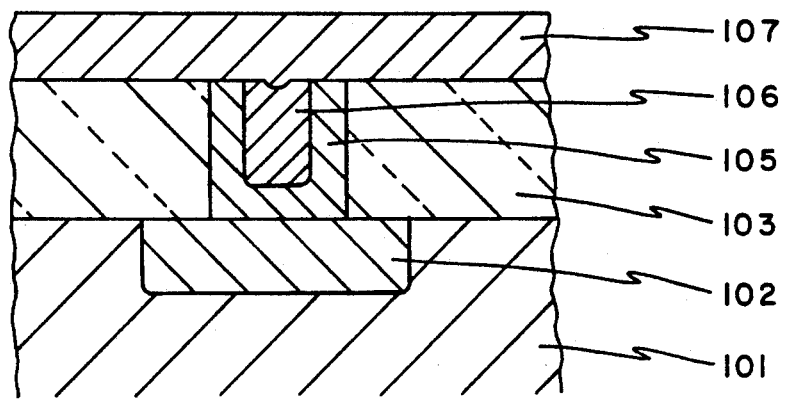

Finally, as shown in FIG. 1(f), an aluminum film is deposited and patterned to form a upper wiring layer 107. The surface of the interconnection layer is planarized and has no step, so that full contact between upper wiring layer 107 and doped polysilicon film 105 can be ensured. The resistance between the upper wiring layer 107 and the n-type diffusion layer 102 is about 60 $\Omega$.

In this embodiment, the reactive ion etching technique with $SF_6$ gas is applied to the etching of the non-doped polysilicon film because the etching rate is high. To this step, therefore, higher rate etching technique such as plasma etching can be applied. Alternatively, consistent application of only the reactive ion etching technique with CF$_4$ gas is possible. In this case, the etching time is longer but etching equipment and process are simpler. Besides the surface can be planarized more surely.

The description with phosphorus as a dopant has been given above. Other dopants such as arsenic and boron may be used. Suitable etching gases for use include carbon tetrafluoride gas and other carbon fluorides such as dicarbon hexafluoride (C$_2$F$_6$) and tricarbon octafluoride C$_3$F$_8$. Additionally gaseous mixtures of a plurality of carbon fluorides can be used.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device comprising the steps of:

preparing a semiconductor substrate having a major surface with a diffusion layer formed at said major surface;

forming an interlayer insulating film on said major surface of said semiconductor substrate, said interlayer insulating film having an upper surface;

opening a contact hole in said interlayer insulating film, said opening extending from said upper surface of said interlayer insulating film to said major surface of said semiconductor substrate to expose a part of said diffusion layer, said contact hole having an inside wall surrounding said contact hole;

depositing a doped polycrystalline silicon film, while supplying phosphorus thereinto, said doped polycrystalline silicon film being deposited onto said upper surface of said interlayer insulating film, onto said inside wall of said contact hole, and onto said exposed part of said diffusion layer within said contact hole, the thickness of said doped polycrystalline silicon film being thin enough so that a said doped polycrystalline silicon film forms a concavity within and above said contact hole;

depositing a nondoped polycrystalline silicon film on said doped polycrystalline silicon film within and above said contact hole, said nondoped polycrystalline silicon film running over said concavity and over said doped polycrystalline silicon film above said upper surface of said interlayer insulating film;

etching away said nondoped polycrystalline silicon film by a reactive ion etching method with a sulfur hexafluoride gas, said etching continuing until it just exposes said doped polycrystalline silicon film above said upper surface of said interlayer insulation film and leaves said nondoped polycrystalline silicon film in only said concavity; and further etching said doped polycrystalline silicon film and said nondoped polycrystalline silicon film simultaneously by a reactive ion etching method using a carbon fluoride gas, said further etching continuing until said upper surface of said interlayer insulating film is just exposed and the upper surface of said doped polycrystalline silicon film and said nondoped polycrystalline silicon film left in said contact hole is coplanar with said upper surface of said interlayer insulating film.

2. A method of claim 1, wherein said carbon fluoride gas is carbon tetrafluoride gas.

3. A method of manufacturing a semiconductor device of claim 1, in which said interlayer insulating film is made of silicon oxide.

4. A method of manufacturing a semiconductor device of claim 1, in which the thickness of said nondoped polycrystalline silicon film is thicker than the thickness of said doped polycrystalline silicon film.

5. A method of manufacturing a semiconductor device of claim 1, in which said reactive ion etching with said sulfur hexafluoride gas and said reactive ion etching with said carbon fluoride gas are performed in the same etching system.

6. A method of manufacturing a semiconductor device of claim 1 further comprising a step of forming an upper wiring layer on said exposed upper surface of said interlayer insulating film and on said upper surface of said silicon films in said contact hole in order to make an electrical connection to said diffusion layer in said semiconductor substrate via said silicon films.

* * * * *